United States Patent
Lee et al.

(10) Patent No.: US 9,074,281 B2
(45) Date of Patent: Jul. 7, 2015

(54) METHODS FOR FABRICATING NANOCRYSTALLINE DIAMOND FILM

(71) Applicant: KOREA INSTITUTE OF SCIENCE AND TECHNOLOGY, Seoul (KR)

(72) Inventors: Wook Seong Lee, Seoul (KR); Hak Joo Lee, Incheon (KR); Young Joon Baik, Seoul (KR); Jong Keuk Park, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 106 days.

(21) Appl. No.: 13/799,419

(22) Filed: Mar. 13, 2013

(65) Prior Publication Data

US 2013/0260157 A1 Oct. 3, 2013

(30) Foreign Application Priority Data

Mar. 28, 2012 (KR) ........................ 10-2012-0031830

(51) Int. Cl.
*C23C 16/27* (2006.01)
*C23C 16/02* (2006.01)

(52) U.S. Cl.
CPC ............... *C23C 16/27* (2013.01); *C23C 16/02* (2013.01); *C23C 16/0254* (2013.01); *C23C 16/271* (2013.01); *C23C 16/272* (2013.01)

(58) Field of Classification Search
CPC ...................................................... C23C 16/27
USPC .............................. 427/249.8, 249.14, 255.37
See application file for complete search history.

(56) References Cited

U.S. PATENT DOCUMENTS

| 6,198,218 B1* | 3/2001 | Kobashi et al. ............... 313/504 |
| 7,556,982 B2* | 7/2009 | Carlisle et al. ............... 438/105 |
| 2010/0181534 A1* | 7/2010 | Shenderova et al. ...... 252/301.16 |
| 2014/0264777 A1* | 9/2014 | Hobart et al. ................. 257/627 |

FOREIGN PATENT DOCUMENTS

| JP | 2009-120929 A | 6/2009 |
| KR | 1020110093700 A | 8/2011 |
| WO | WO 2010/009467 A2 * | 1/2010 |

OTHER PUBLICATIONS

Sekaric, L., et al., "Nanomechanical resonant structures in nanocrystalline diamond". Applied Physics Letters, vol. 81 No. 23, Dec. 2, 2002, p. 4455-4457.*
Williams, Oliver A., et al., "Growth and properties of nanocrystalline diamond films". Phys. stat. sol. (a) 203, No. 13, 3375-3386 (2006).*

(Continued)

*Primary Examiner* — Bret Chen
(74) *Attorney, Agent, or Firm* — Ladas & Parry LLP

(57) ABSTRACT

Methods for fabricating uniform nanocrystalline diamond thin films with minimized voids are presented. These uniform nanocrystalline diamond thin films can be formed on any number of treated silicon oxide surfaces such as on hydrogen plasma treated surfaces of silicon oxide-coated substrates or on hydrocarbon plasma pre-treated surfaces of silicon oxide-coated substrates. It is believed that treating these surfaces results in maximizing electrostatic attraction between these treated surfaces with nanodiamond particles during a subsequent ultrasonic seeding of the nanodiamond particles onto these threated surfaces. This can result in the nanodiamond particles being substantially uniformly distributed and bound on the treated silicon oxide surface.

20 Claims, 11 Drawing Sheets

(56) References Cited

OTHER PUBLICATIONS

Krauss, A.R., et al., "Ultrananocrystalline diamond thin films for MEMS and moving mechanical assembly devices". Diamond and Related Materials 10 (2001) 1952-1961.*

Buijnsters, J.G., et al., "Enhancement of the nucleation of smooth and dense nanocrystalline diamond films by using molybdenum seed layers". Journal of Applied Physics 108, 103514 (2010), pp. 1-9.*

Gruen, Dieter M., "Nanocrystalline Diamond Films". Annu. Rev. Mater. Sci. 1999 29:211-59.*

S. Bhattacharyya, et al; "Synthesis and characterization of highly-conducting nitrogen-doped ultrananocrystalline diamond films", Applied Physics Letters, vol. 79, No. 10, Sep. 3, 2001, pp. 1441-1443.

Hak-Joo Lee, et al; "Synergistic Interaction between Substrate and Seed Particles in Ultrathin Ultrananocrystalline Diamond Film Nucleation on $SiO_2$ with Controlled Surface Termination", The Journal of Physical Chemistry, vol. 166, pp. 9180-9188, Apr. 9, 2012.

Anirudha V. Sumant, et al; "Surface composition, bonding, and morphology in the nucleation and growth of ultra-thin, high quality nanocrystalline diamond films", Diamond & Related Materials, vol. 16, pp. 718-724, Available online Jan. 31, 2007.

James E. Butler, et al; "The CVD of Nanodiamond Materials", Chemical Vapor Deposition, vol. 14, Issue 7-8, pp. 145-160, Article first published online: Aug. 15, 2008.

* cited by examiner

METHODS FOR FABRICATING NANOCRYSTALLINE DIAMOND FILM

CROSS-REFERENCE TO RELATED APPLICATION

This application claims priority to Korean Patent Application No. 10-2012-0031830, filed on Mar. 28, 2012, and all the benefits accruing therefrom under 35 U.S.C. §119, the contents of which in its entirety are herein incorporated by reference.

BACKGROUND

1. Field

Embodiments relate to a nanocrystalline diamond thin film and a method for fabricating same. More particularly, embodiments relate to a uniform nanocrystalline diamond thin film with minimized voids formed on a silicon oxide-coated substrate and a method for fabricating the same. Such nanocrystalline diamond thin film is formed by performing hydrogen plasma treatment, hydrocarbon plasma treatment or hydrocarbon thermal treatment on the substrate surface to maximize electrostatic attraction between the substrate surface and nanodiamond particles during the following ultrasonic seeding such that the nanodiamond particles are uniformly distributed and bound on the silicon oxide on the substrate.

2. Description of the Related Art

The nanocrystalline diamond (NCD) or ultrananocrystalline diamond (UNCD) thin film has opened an innovative route for a wide variety of applications. In particular, nanocrystalline diamond (less than 100 nm in thickness) formed on a silicon oxide ($SiO_2$)—coated silicon (Si) substrate is important for nanoelectromechanical system (NEMS) applications. Also, the nanocrystalline diamond thin film is used as a hermetic coating over the 3-dimensional geometry of the microelectrode arrays for implanted retinal prosthesis or as a dielectric layer of a localized surface plasmon resonance (LSPR) sensor.

Meanwhile, it is very difficult to grow a void-free nanocrystalline diamond thin film on the silicon oxide surface due to low nucleation density and long pretreatment time when compared to the growth on the pristine silicon substrate (Bhattacharyya, S.; Auciello, O.; Birrell, J.; Carlisle, J. A.; Curtiss, L. A.; Goyette, A. N.; Gruen, D. M,; Krauss, A. R.; Schlueter, J.; Sumant, A.; Zapol, P. *Applied Physics Letters* 2001, 79, 1441.).

When a hydrogen-rich, rather than argon (Ar)-rich, precursor gas is used to grow the nanocrystalline diamond thin film, the nucleation rate is decreased due to the etching action of the high-concentration hydrogen. Nonetheless, hydrogen-rich precursor gas is still prevailing for nanocrystalline diamond synthesis due to better plasma stability in microwave plasma chemical vapor deposition (MWCVD) or direct current plasma-assisted chemical vapor deposition (DC-PACVD) or due to a much wider gas composition window in hot filament chemical vapor deposition (HFCVD).

Bias enhanced nucleation (BEN) technique has been widely adopted for enhancing nucleation for diamond synthesis on a silicon substrate. However, although it is appropriate for an electrically conducting substrate, the technique is not suitable for a non-conducting substrate such as an oxide-coated substrate and is limited in large-area diamond deposition.

Ultrasonic treatment of a substrate immersed in a diamond powder suspension is also widely adopted for nucleation enhancement. Initially, it was argued that the nucleation was enhanced by scratching on the substrate surface by microdiamond particles when the suspension of microdiamond particles was used for ultrasonic treatment. It was subsequently discovered that the diamond particles remaining on the substrate was responsible for the enhancement of nucleation.

By contrast, for growth of the nanocrystalline diamond thin film, a suspension of nanodiamond particles is used. The nanodiamond particles are transferred from the suspension to the substrate by ultrasonic seeding. In this context, various efforts were made to enhance the dispersion efficiency of the nanodiamond particles onto the substrate, including functionalization of the seed particle surface, addition of a surfactant to the suspension or adjustment of the pH of the suspension. Furthermore, ball-milling of the nanodiamond particles using ceramic beads or thermal treatment of the nanodiamond particles under hydrogen atmosphere is also employed to increase the dispersion efficiency of the nanodiamond particles.

However, such efforts are directed exclusively to the diamond particles, not to the substrate onto which the diamond particles are transferred.

SUMMARY

Embodiments are directed to providing a uniform nanocrystalline diamond thin film with minimized voids formed on a silicon oxide-coated substrate by performing hydrogen plasma treatment, hydrocarbon plasma treatment or hydrocarbon thermal treatment on the substrate surface to maximize electrostatic attraction between the substrate surface and nanodiamond particles during the following ultrasonic seeding such that the nanodiamond particles are uniformly distributed and bound on the silicon oxide on the substrate and a method for fabricating same.

According to an aspect, embodiments provide a method for fabricating a nanocrystalline diamond thin film, including: preparing a silicon oxide-coated silicon substrate; surface-treating the substrate; immersing the substrate in a suspension of nanodiamond particles and dispersing and binding the nanodiamond particles onto the substrate by applying ultrasonic wave; and growing a nanocrystalline diamond thin film on the substrate on which the nanodiamond particles are bound, wherein, as a result of the surface treatment, an absolute value of a potential difference between the substrate and the nanodiamond particles becomes larger than that before the surface treatment.

In the step of surface-treating the substrate, an Si—O bond of silicon oxide may be changed to a silanol group. Also, the Si—O bond of silicon oxide may be changed to a silanol group or a Si—$CH_3$ bond.

The substrate surface may be treated with a hydrogen plasma or with a hydrogen plasma and a hydrocarbon plasma. Alternatively, the substrate may be thermally treated under a mixture gas atmosphere of hydrogen and hydrocarbon.

As a result of the surface treatment, a potential of the substrate may increase in negative (−) direction. And, as a result of the surface treatment, an absolute value of a difference between a zeta potential ($\zeta_p$) of the particles and a zeta potential ($\zeta_s$) of the substrate may become larger than that before the surface treatment.

The nanocrystalline diamond thin film may be grown by chemical vapor deposition.

According to another aspect, embodiments provide a nanocrystalline diamond thin film including: a silicon oxide-coated silicon substrate; nanodiamond particles provided on the silicon oxide; and a nanocrystalline diamond layer formed on the silicon oxide including the nanodiamond particles, wherein the nanodiamond particles are dispersed and bound onto the silicon oxide by ultrasonic seeding, wherein said ultrasonic seeding includes immersing the substrate in a suspension of nanodiamond particles and dispersing and binding the nanodiamond particles onto the substrate by applying ultrasonic wave, and wherein the silicon oxide is surface-treated by plasma treatment or thermal treatment and, as a result of the surface treatment, an absolute value of a potential difference between the substrate and the nanodiamond particles becomes larger than that before the surface treatment.

BRIEF DESCRIPTION OF THE DRAWINGS

The above and other aspects, features and advantages of the disclosed exemplary embodiments will be more apparent from the following detailed description taken in conjunction with the accompanying drawings in which:

FIG. 5b shows a result of energy dispersive x-ray (EDX) spectroscopy analysis along the arrow direction in FIG. 5a;

FIG. 5c shows selected area electron diffraction (SAED) patterns of regions shown in FIG. 5a.

DETAILED DESCRIPTION

Figure 1A:
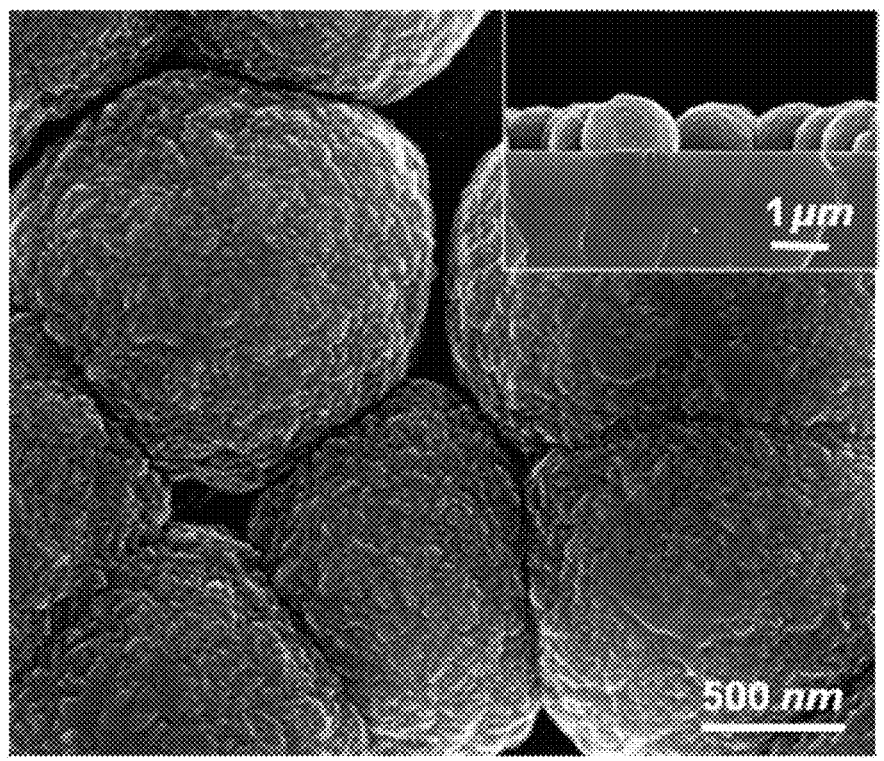
FIGS. 1a and 1b show scanning electron microscope (SEM) images of nanocrystalline diamond grown on a silicon oxide-coated silicon substrate (hare $SiO_2$/Si) and a silicon substrate (bare Si), which are not surface-treated.

Exemplary embodiments now will be described more fully hereinafter with reference to the accompanying drawings, in which exemplary embodiments are shown.

A method for fabricating a nanocrystalline diamond thin film according to an embodiment comprises 1) surface treatment of a substrate, 2) ultrasonic seeding and 3) growth of a nanocrystalline diamond thin film by chemical vapor deposition.

In the step 1) of substrate surface treatment, the surface of a silicon oxide ($SiO_2$)— coated silicon substrate is treated with a hydrogen plasma or with a hydrogen plasma and a hydrocarbon plasma or is thermally treated under a mixture gas atmosphere of hydrogen and hydrocarbon. As a result of the substrate surface treatment, an Si—OH bonding or an Si—CH$_3$ bonding is formed on the silicon oxide.

As the Si—OH bonding or the Si—CH$_3$ bonding is formed, the surface potential of the substrate increases in negative (−) direction. Typically, the surface of a silicon substrate or a silicon oxide-coated silicon substrate has a negative (−) potential. As a result of the surface treatment, the absolute value of the potential of the substrate surface increases by the Si—OH bonding or the Si—CH$_3$ bonding on the substrate surface.

In the step 2) of ultrasonic seeding, the surface-treated substrate is immersed in a suspension of nanodiamond particles and the nanodiamond particles are seeded on the substrate by applying ultrasonic wave such that they are bound to the substrate surface. The nanodiamond particles dispersed in the suspension has a positive (+) potential. Accordingly, the nanodiamond particles having a positive (+) potential are bound to the substrate surface having a negative (−) potential via electrostatic attraction.

In the step 3) of growth of a nanocrystalline diamond thin film by chemical vapor deposition, a diamond thin film is grown by chemical vapor deposition in the state where the nanodiamond particles are bound onto the substrate by the ultrasonic seeding. The nanodiamond particles bound onto the substrate by the ultrasonic seeding serve as nucleation sites for the growth of the diamond thin film.

Embodiments are directed to growing a nanocrystalline diamond thin film with minimized voids. To achieve this, the nanodiamond particles should be seeded and bound with uniform density on the entire surface of the substrate during the ultrasonic seeding step.

The purpose of the step 1) of substrate surface treatment is to increase the possibility of the seeding and binding of the nanodiamond particles onto the substrate. Through the substrate surface treatment, the potential difference between the substrate surface and the nanodiamond particles dispersed in the suspension is induced to be maximized so as to enhance the binding rate of diamond onto the substrate.

Since the nanodiamond particles dispersed in the suspension have the positive (+) potential, the potential difference between the substrate surface and the nanodiamond particles dispersed in the suspension may be increased by increasing the negative (−) potential of the substrate surface through the surface treatment. The increase in the negative (−) potential through the surface treatment results from the Si—OH bonding formed by the substrate surface treatment.

Meanwhile, the potential of the substrate surface and the nanodiamond particles may be interpreted in various ways. In an embodiment, the zeta potential ($\zeta$-potential) concept may be employed in this regard. Typically, zeta potential is an electrically quantitated measure of the degree of dispersion of particles in a dispersion medium. In case of the step 2) of ultrasonic seeding, the zeta potential of the nanodiamond particles in the suspension and the zeta potential of the substrate need to be distinguished since not only the nanodiamond particles but also the substrate are present in the solution.

Since the nanodiamond particles are ultimately bound to the substrate surface, the binding of the nanodiamond particles onto the substrate may be quantitatively expected by measuring the zeta potential of the nanodiamond particles and the zeta potential of the substrate. Furthermore, by controlling the zeta potential of the nanodiamond particles and the zeta potential of the substrate, the binding rate of the nanodiamond particles onto the substrate may be enhanced.

In the embodiments of the present disclosure, the zeta potential of the substrate is controlled to enhance the binding rate of the nanodiamond particles onto the substrate. Specifically, as described above, the zeta potential of the substrate may be increased in negative (−) direction by forming the Si—OH bonding through the substrate surface treatment. The increase of the zeta potential of the substrate in the negative (−) direction by formation of the Si—OH bonding may be confirmed from the experimental result described in the Examples section. Since the zeta potential of the nanodiamond particles dispersed in the suspension has a positive (+) value of a predetermined level, the binding rate of the nanodiamond particles onto the substrate is improved as the difference of the zeta potential of the substrate with the zeta potential of the nanodiamond particles is larger.

The method for growing the nanocrystalline diamond thin film with minimized voids is described above. It is also described that, to achieve this, the nanodiamond particles should be uniformly dispersed and bound onto the substrate during the ultrasonic seeding and the surface treatment of the substrate for enhancing the binding rate of the nanodiamond particles is required. Hereinafter, the conditions of the respective steps of the method fix fabricating a nanocrystalline diamond thin film of the present disclosure, i.e. the step 1) of substrate surface treatment, the step 2) of ultrasonic seeding and the step 3) of growth of the nanocrystalline diamond thin film by chemical vapor deposition, will be described.

1) The substrate surface treatment step may comprise plasma treatment or thermal treatment. When plasma treatment is employed, it may be accomplished in a chamber wherein plasma may be generated, for example, a DC-plasma assisted CVD (DC-PACVD) chamber. After loading the silicon oxide ($SiO_2$)-coated silicon substrate in the chamber and exposing the substrate to a hydrogen ($H_2$) plasma or to a hydrogen ($H_2$) plasma and a hydrocarbon ($CH_4$) plasma, the Si—O bond of the silicon oxide is converted to an Si—OH bond or a Si—$CH_3$.

When thermal treatment is employed, the silicon oxide ($SiO_2$)-coated substrate is loaded in a thermal treatment chamber, e.g. a hot filament CVD (HFCVD) chamber. When a mixture gas of hydrogen and hydrocarbon is supplied into the chamber and thermal treatment is carried out at a predetermined temperature, the Si—O bond of the silicon oxide is converted to an Si—$CH_3$ bond.

2) The ultrasonic seeding step may be carried out by immersing the surface-treated substrate in a methanol solution wherein nanodiamond particles are dispersed and performing ultrasonic treatment.

3) The growth of the nanocrystalline diamond thin film by chemical vapor deposition may be carried out by performing chemical vapor deposition using hydrogen and hydrocarbon gases as precursors. The chemical vapor deposition may be carried out by DC-PACVD and the precursor mixture may comprise about 95 to 98% of hydrocarbon and about 2 to 5% of hydrocarbon. The chemical vapor deposition may be performed at about 700 to 900° C.

The method for fabricating, a nanocrystalline diamond thin film according to embodiments will be described through an experimental example.

EXAMPLE 1

Experimental Methods

A silicon oxide ($SiO_2$)-coated silicon substrate was treated with a hydrogen plasma (*), treated with a hydrogen plasma and a hydrocarbon plasma () or thermally treated in the presence of a mixture gas of hydrogen and hydrocarbon (*). Subsequently, the substrate was ultrasonically seeded (ultrasonic treatment) and the binding of the nanodiamond particles was characterized. After the ultrasonic seeding, a nanocrystalline diamond film was grown by chemical vapor deposition (UNCD deposition) and characterized. Also, a nanocrystalline diamond film was grown on a silicon substrate (bare Si) and a silicon oxide ($SiO_2$)-coated silicon substrate (bare $SiO_2$/Si), which were not surface-treated.

During the ultrasonic seeding, the zeta potential of the nanodiamond particles and the zeta potential of the substrate were measured, with the surface-treated substrate immersed in the suspension of nanodiamond particles, and the result was compared with the zeta potentials measured after immersing each surface-treated substrate in a standard solution.

Experimental conditions of the hydrogen plasma treatment (*), hydrogen plasma and hydrocarbon plasma treatment (), thermal treatment in the presence: of the mixture gas of hydrogen and hydrocarbon (*), ultrasonic seeding and growth of the nanocrystalline diamond are described in Table I. The silicon oxide ($SiO_2$) coated on the silicon substrate was formed by using a sulfuric acid peroxide mixture (SPM) to a thickness of about 20 nm on a 4-inch silicon substrate.

TABLE 1

Experimental conditions

| Process | Gas Composition | Total Gas flow [sccm] | Pressure [Torr] | Time [min] | CVD System | Discharge/ Filament Voltage [V] | Discharge/ Filament Current [A] | Substrate Temperature [° C.] |
|---|---|---|---|---|---|---|---|---|
| (*)Hydrogen Plasma treatment | 100% $H_2$ | 150 | 30 | 5 | DC-PACVD | 450 | 25 | below 500 |
| (**)Hydrocarbon plasma treatment | 6% $CH_4$ 94% $H_2$ | 150 | 30 | 30 | DC-PACVD | 450 | 25 | below 500 |
| (***)Hydrocarbon thermal treatment | 6% $CH_4$ 94% $H_2$ | 150 | 30 | 30 | HF-CVD | 50 | 220 | 800 |
| Ultrasonic treatment | Ultrasonic Seeding: using nano diamond mixed methanol for 60 min Ultrasonic Cleaning: using ethanol for 30 sec (3 times) | | | | | | | |
| UNCD deposition | 3% $CH_4$ 97% $H_2$ | 150 | 80 | 10-240 | DC-PACVD | 450 | 25 | 750-800 |

EXAMPLE 2

Experimental Result

Figure 1B:
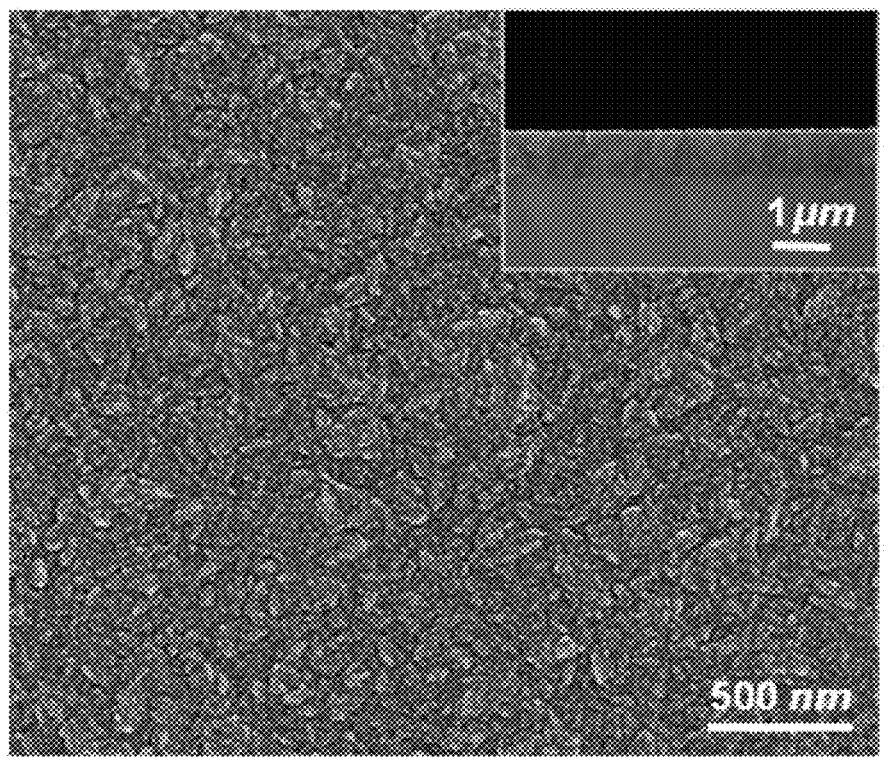

FIGS. 1a and 1b show scanning electron microscope (SEM) images of nanocrystalline diamond grown on a silicon oxide-coated silicon substrate (bare $SiO_2$/Si) and a silicon substrate (bare Si), which were not surface-treated. The nanocrystalline diamond was synthesized for 4 hours by DC-PACVD and other experimental condition was the same as that of the nanocrystalline diamond growth in Example 1.

Referring to FIG. 1a, a discontinuous diamond thin film comprising clusters with a diameter of 1 μm or larger was grown on the bare $SiO_2$/Si. Referring to FIG. 1b, a well-defined continuous diamond thin film was grown on the bare Si. This indicates that the initial nucleation density is much lower for the bare $SiO_2$/Si substrate as compared to the bare Si substrate. The same result was observed when the film was grown by thermal deposition (HFCVD) not by the plasma deposition (DC-PACVD). Accordingly, improvement of the nucleation density is necessary to synthesize a continuous UNCD thin film on the $SiO_2$/Si substrate. The nucleation density could not be improved significantly through increase of ultrasonic seeding time or rinsing instead of ultrasonic cleaning.

Figure 2A:
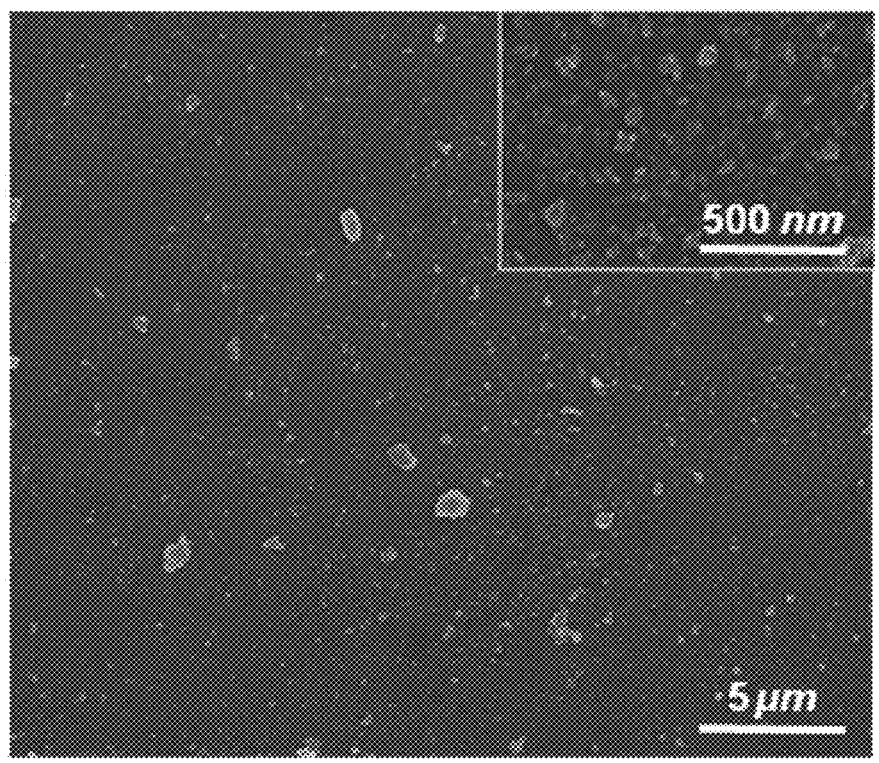
FIGS. 2a to 2d show high resolution SEM (HR-SEM) images of nanodiamond particles dispersed and bound onto substrates after ultrasonic seeding in Example 1.
Figure 2B:
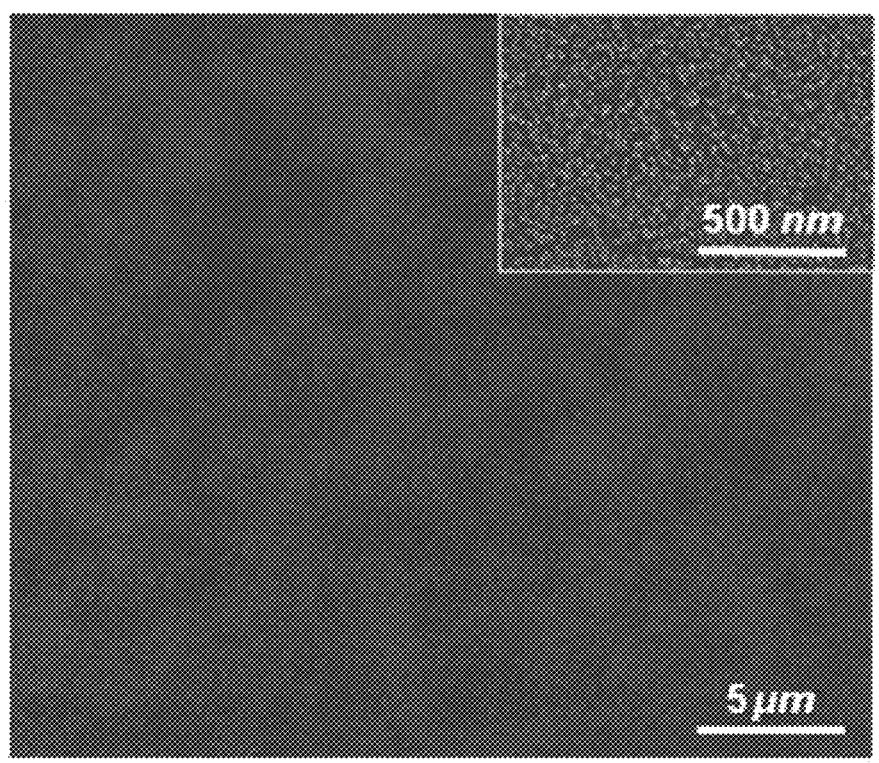
Figure 2C:
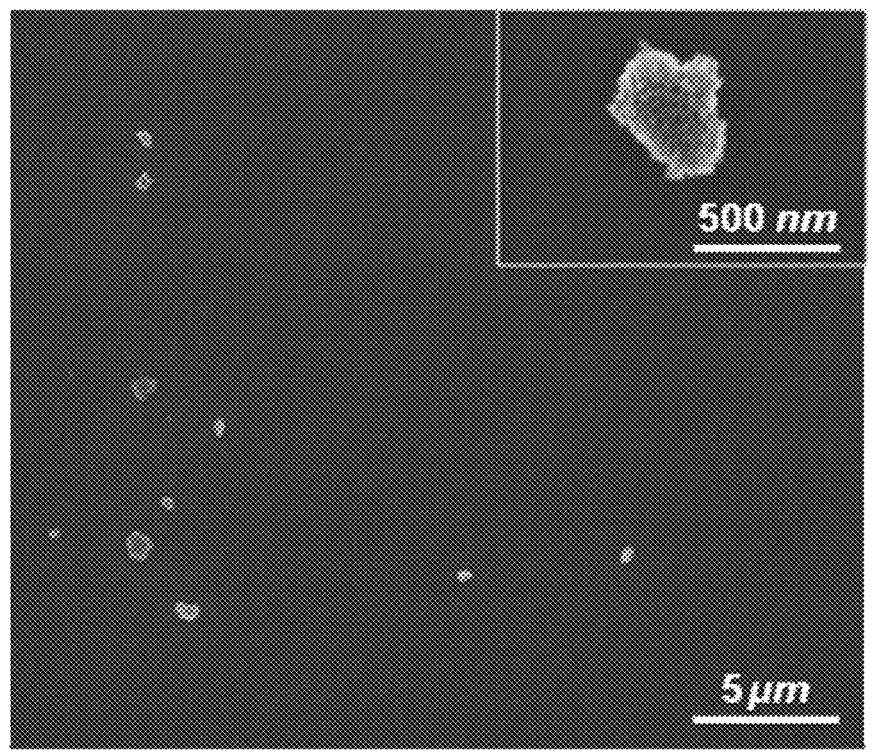
Figure 2D:
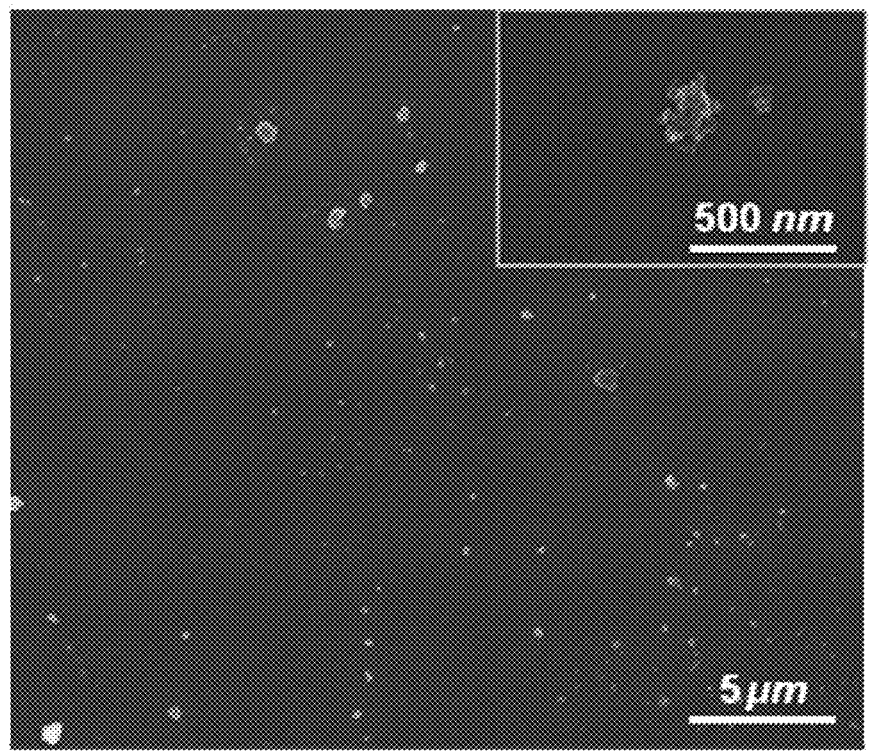

FIGS. 2a to 2d show high resolution SEM (HR-SEM) images of the nanodiamond particles dispersed and bound onto the substrates after the ultrasonic seeding in Example 1: FIG. 2a—bare $SiO_2$/Si; FIG. 2b—hydrogen plasma-treated $SiO_2$/Si (hereinafter, denoted as *$SiO_2$/Si); FIG. 2c—hydrogen plasma- and hydrocarbon plasma-treated $SiO_2$/Si (hereinafter, denoted as $SiO_2$/Si); FIG. 2d—$SiO_2$/Si thermally treated in the presence of the mixture gas of hydrogen and hydrocarbon (hereinafter, denoted as *$SiO_2$/Si). Referring to FIG. 2a, the nanodiamond particles are aggregated with an average size of 100 nm and clusters of hundreds of nanometers in size are also observed. In contrast, the nanodiamond particles of FIG. 2b show a much smaller size. No large cluster was observed and the nanodiamond particles are densely and uniformly dispersed on the whole. To the contrary, in FIG. 2c and FIG. 2d, a small number of clusters with a size of hundreds of nanometers were observed.

The density of the nanodiamond particles obtained front the images was $7.8 \times 10^9$ (FIG. 2a), $4.8 \times 10^{10}$ (FIG. 2b), $3.2 \times 10^6$ (FIG. 2c) and $7.6 \times 10^7$ (FIG. 2d) nuclei/cm$^2$, respectively. The hydrogen plasma-treated substrate (*$SiO_2$/Si) exhibited more than 6 times improved as compared to the surface-untreated substrate ($SiO_2$/Si).

Figure 3A:
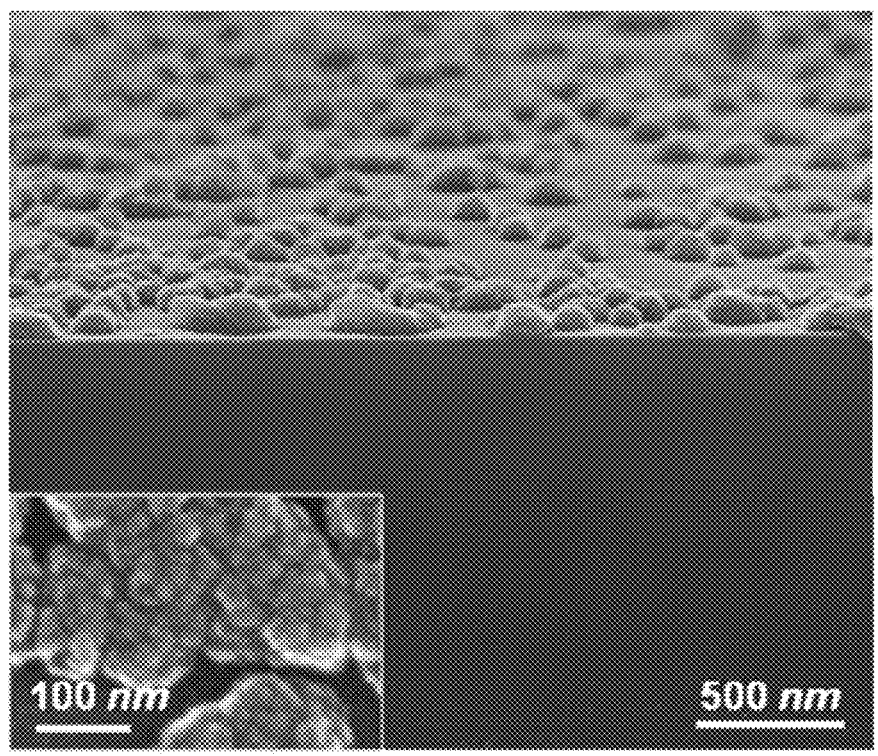
FIGS. 3a and 3b show HR-SEM images of nanocrystalline diamond grown on bare $SiO_2$/Si and hydrogen plasma-treated $SiO_2$/Si (*$SiO_2$/Si) for 30 minutes by direct current plasma-assisted chemical vapor deposition (DC-PACVD)
Figure 3B:
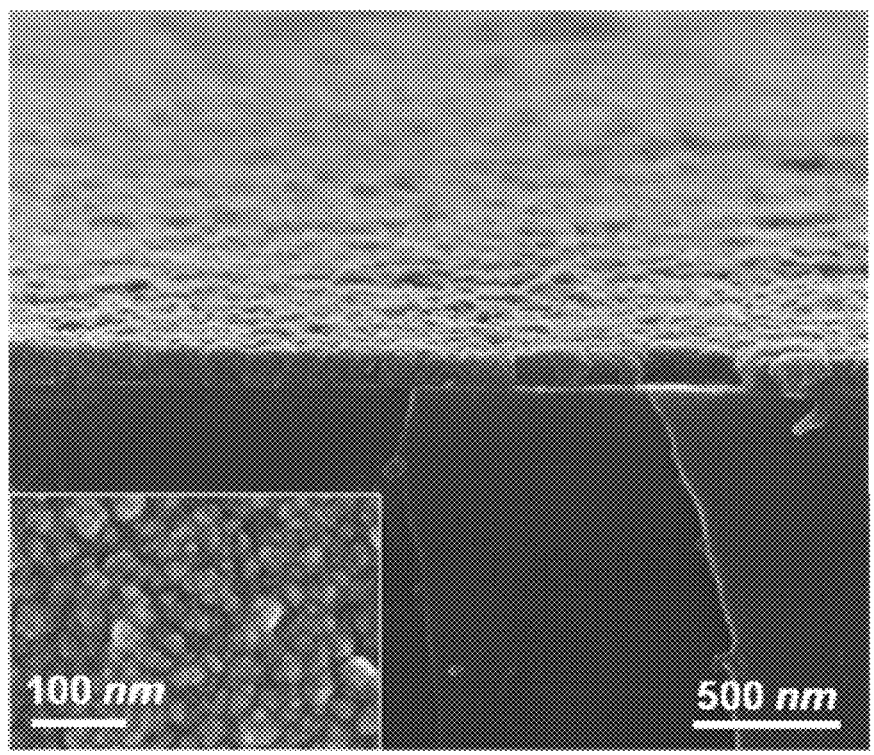

FIGS. 3a and 3b are HR-SEM images of the nanocrystalline diamond grown on hare $SiO_2$/Si and hydrogen plasma-treated $SiO_2$/Si (*$SiO_2$/Si) for 30 minutes by DC-PACVD, respectively. No significant difference was observed in the crystal particles as shown in insets in FIGS. 3a and 3b, but the tilt image revealed that, in case of the bare $SiO_2$/Si, the substrate surface was not covered less than half not to mention the formation of a continuous thin film (see FIG. 3a). In contrast, in case of the *$SiO_2$/Si, no void was observed and a continuous UNCD thin film with a thickness of about 100 nm was formed. This reveals that the surface treatment using a hydrogen plasma affects the formation of the nanocrystalline diamond thin film.

Figure 4A:
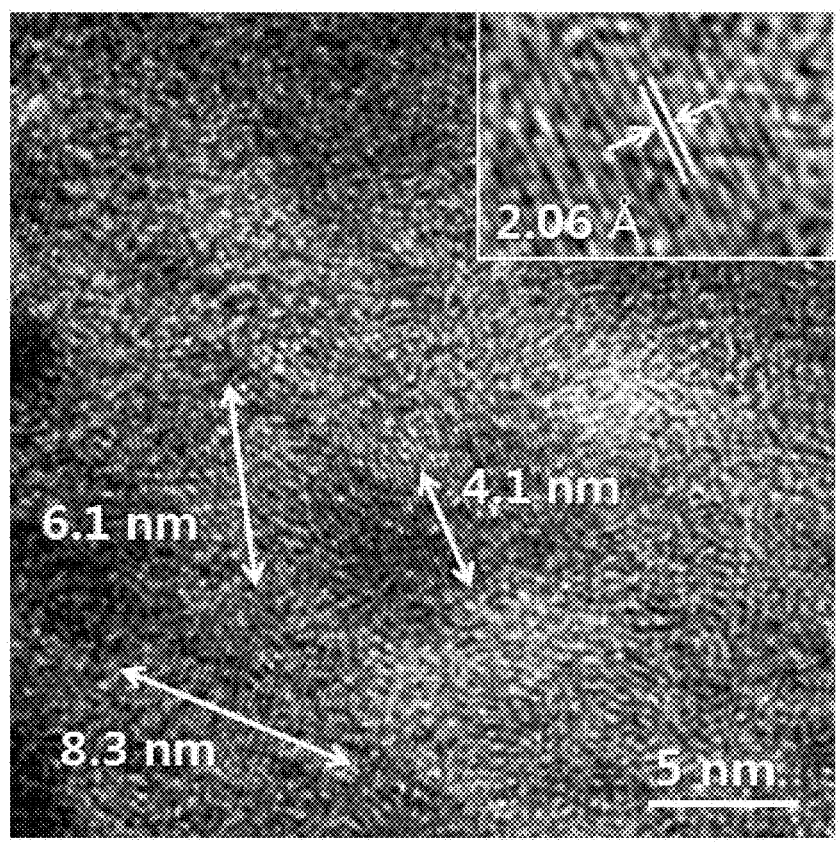
FIG. 4a shows a high resolution transmission electron microscope (HR-TEM) plan-view image of the ultrananocrystalline diamond (UNCD) thin film of FIG. 3b.
Figure 4B:
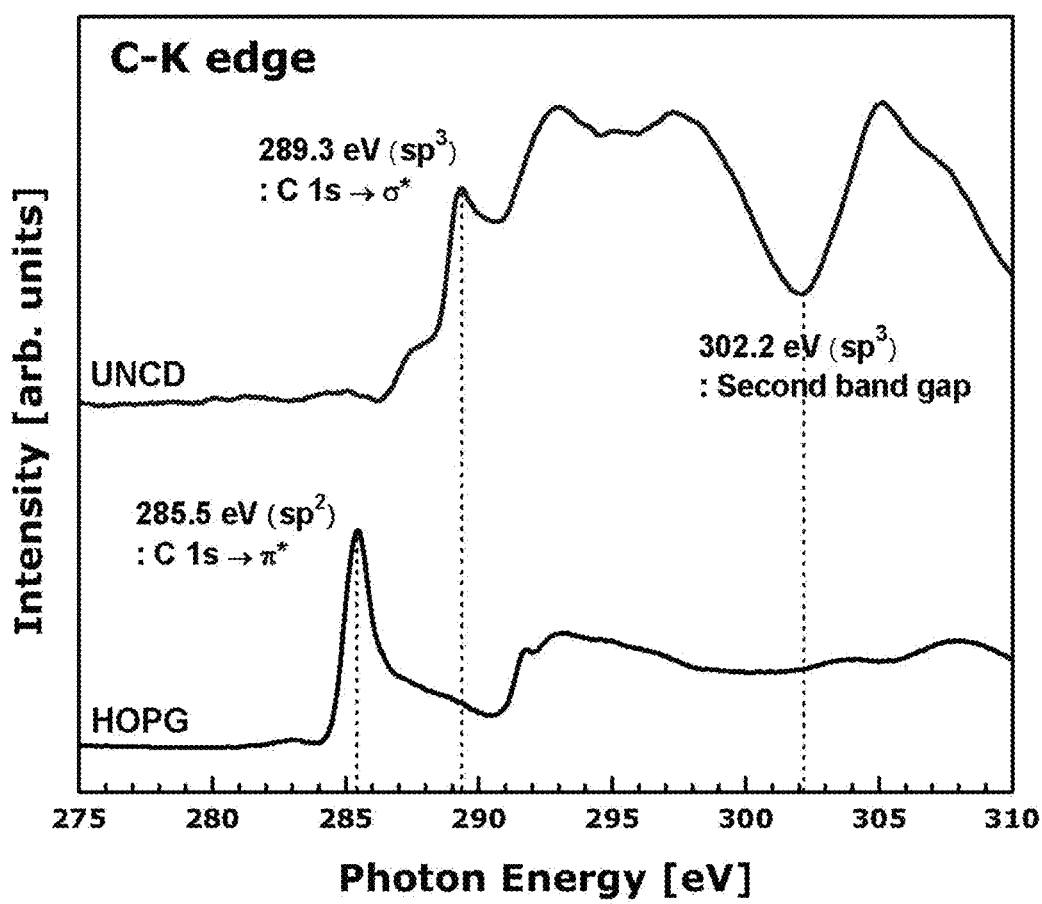
FIG. 4b shows comparison of near edge x-ray absorption fine structure (NEXAFS) C—K edge spectra of the UNCD thin film of FIG. 4a and highly oriented pyrolitic graphite (HOPG)

FIG. 4a shows a high resolution transmission electron microscope (HR-TEM) plan-view image of the UNCD thin film of FIG. 3b. Crystal particles of about 6 to 10 nm in diameter were observed and the interplanar spacing shown in the inset was about 2.06 Å, which corresponded to that of the diamond (111) plane. This result proves that the grown thin film is UNCD. FIG. 4b shows comparison of near edge x-ray absorption fine structure (NEXAFS) C—K edge spectra (edge spectra) of the UNCD thin film of FIG. 4a and highly oriented pyrolitic graphite (HOPG). Referring to FIG. 4b, a sharp peak at about 289.3 eV (C 1s→π* transition) and a large dip at about 302.2 eV (second absolute band gap) are observed, which are characteristic of diamond, whereas a sharp peak is observed at about 285.5 eV (C 1s→π* transition) for HOPG, which is absent in the spectrum of the UNCD thin film.

Figure 5A:
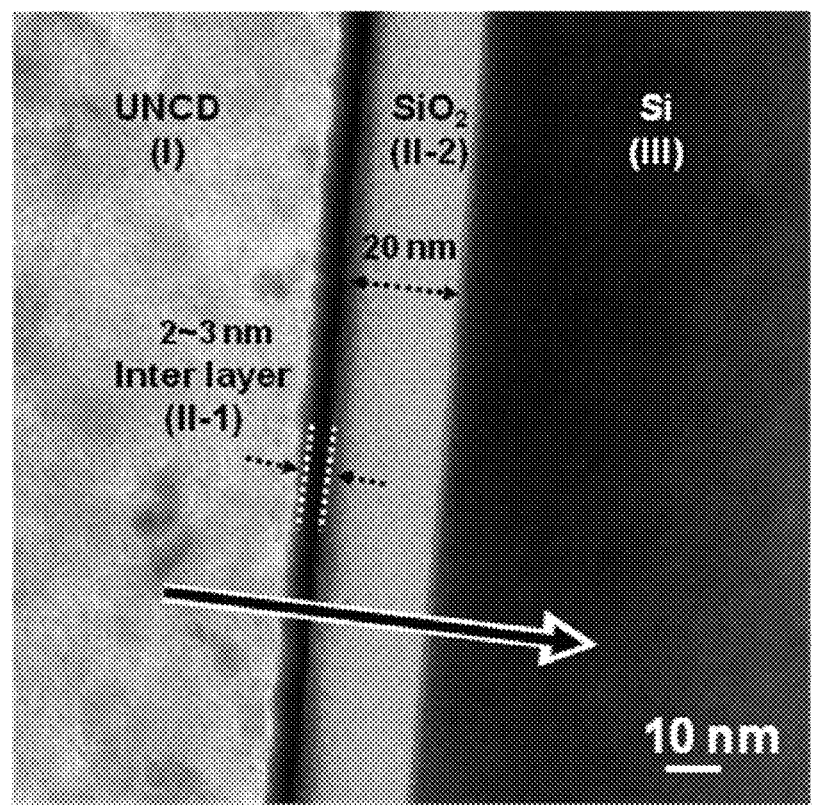
FIG. 5a shows an (HR-TEM cross-sectional image of the UNCD thin film of FIG. 3b.
Figure 5B:
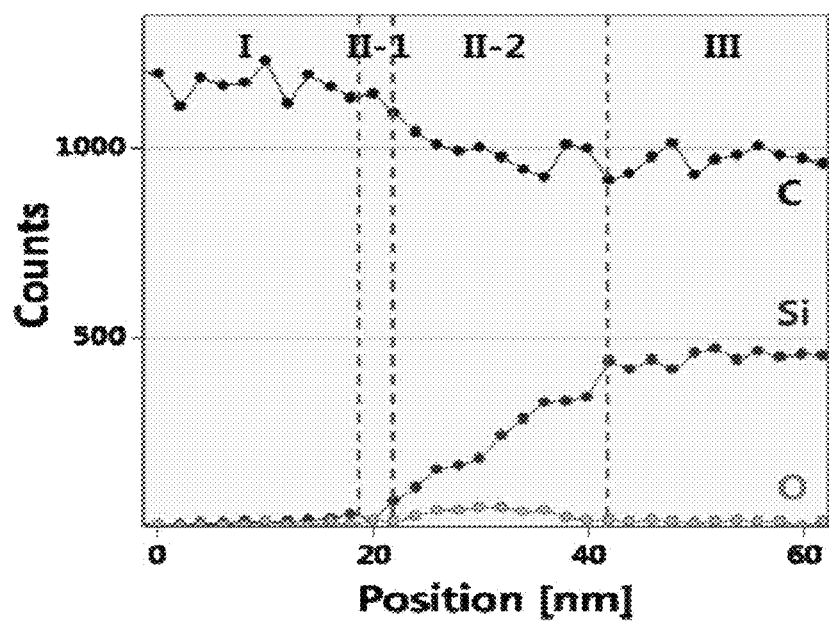
Figure 5C:
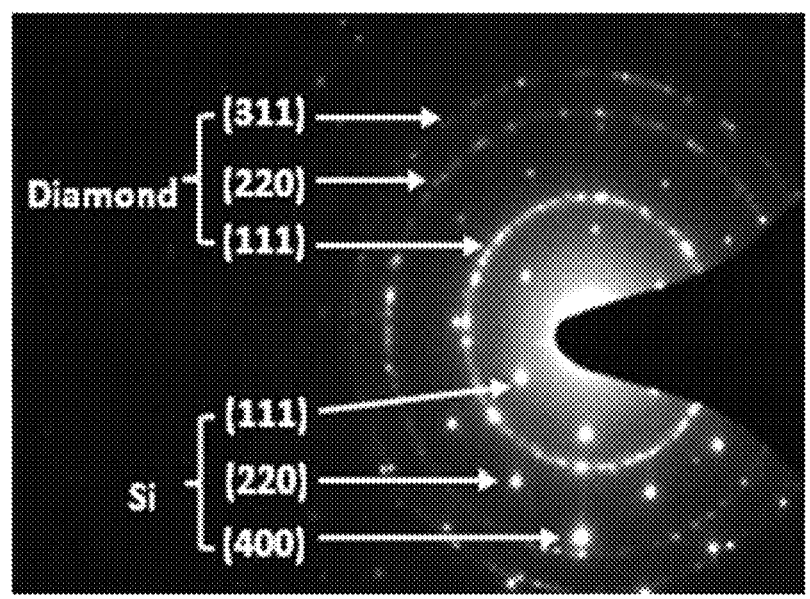

One might attribute the improved nucleation by the hydrogen plasma treatment to complete removal of the 20-nm thick silicon oxide ($SiO_2$) coated on the silicon substrate by etching and consequent exposure of the underlying Si, which is relatively easier in nucleation than $SiO_2$. That is to say, one cannot rule out the possibility that the $SiO_2$ was removed by the hydrogen plasma treatment and the UNCD thin film was grown on the Si substrate. However, such a possibility was rifled out by cross-sectional TEM analysis. FIG. 5a shows a cross-sectional HR-TEM image of the UNCD thin film of FIG. 3b. Referring to FIG. 5a, a stacking structure in the order of UNCD (I), inter layer (II-1), $SiO_2$ (II-2) and Si (III) is clearly seen. It can be seen that the $SiO_2$ layer was maintained with a thickness of about 20 nm. FIG. 5b shows the energy dispersive x-ray (EDX) profile taken along the arrow direction in FIG. 5a. Referring to FIG. 5b, only Si, O and C were detected and no other component was detected in an amount of 0.1% or more. The Si content increased toward the silicon substrate (III), the O content was the highest in II and the C content was the highest in the UNCD thin film (I). A new inter-layer (II-1) was firmed between the UNCD and the $SiO_2$, which is thought of as SiC from the EDX spectroscopy analysis result. FIG. 5c shows selected area electron diffraction (SAED) patterns of the regions shown in FIG. 5a. Point patterns of Si (111), Si (220) and Si (400) owing to the single crystalline structure of the silicon substrate and ring patterns of C (111), C (222) and C (311) owing to the polycrystalline structure of the UNCD thin film are observed.

Figure 6A:
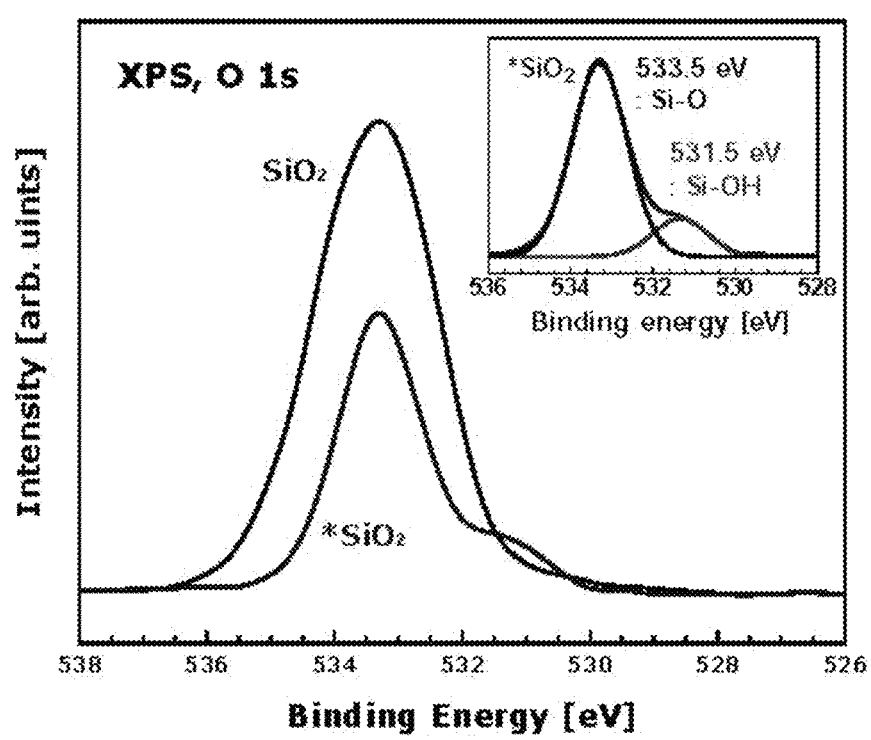
FIG. 6a shows x-ray photoelectron spectroscopy (XPS) O 1s spectra of a bare $SiO_2$/Si substrate and a hydrogen plasma-treated $SiO_2$/Si substrate (*$SiO_2$/Si)
Figure 6B:
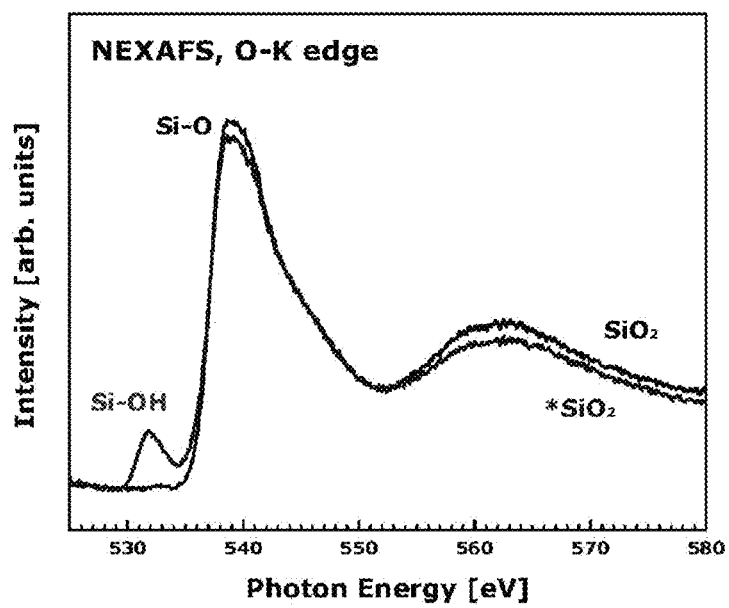
FIG. 6b shows NEXAFS C—K edge spectra of the bare $SiO_2$/Si substrate and the *$SiO_2$/Si substrate.

The diamond dispersion density enhanced by the substrate surface treatment is attributed to modification in molecular structure of the substrate, which will be described below. FIG. 6a shows the x-ray photoelectron spectroscopy (XPS) O 1s spectra of the bare $SiO_2$/Si substrate and the hydrogen plasma-treated $SiO_2$/Si substrate (*$SiO_2$/Si). The peak at about 533.3 eV corresponds to Si—O and the peak at about 531.5 eV corresponds to Si—OH. Referring to FIG. 6a, the spectrum of the bare $SiO_2$/Si substrate was symmetrical about 533.3 eV, which was typical of the pure Si—O bonding. By contrast, the spectrum from the *$SiO_2$/Si substrate was asymmetrical, with distinct Si—OH bonding attributed to the silanol group in addition to the Si—O bonding. FIG. 6b shows the NEXAFS C—K edge spectra of the bare $SiO_2$/Si substrate and the *$SiO_2$/Si substrate. The peak around 532 eV observed only in the spectrum of the *$SiO_2$/Si substrate was also attributed to the silanol group (Si—OH).

Figure 7A:
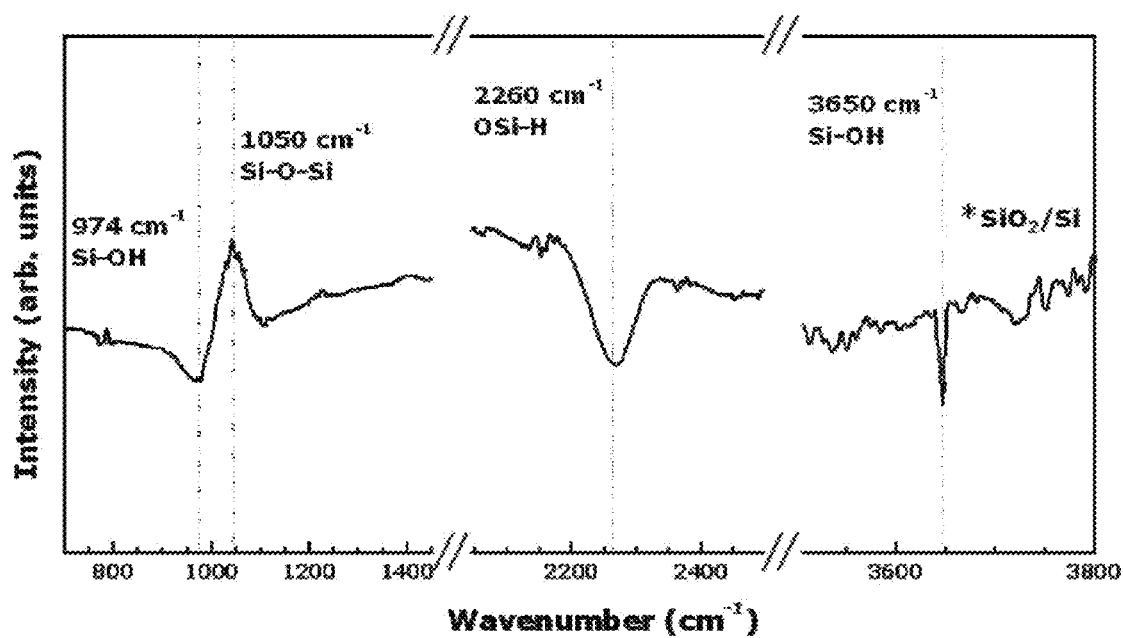
FIG. 7a shows a Fourier transform infrared spectroscopy (FTIR) analysis result of an *$SiO_2$/Si substrate with that of a bare $SiO_2$/Si substrate subtracted.
Figure 7B:
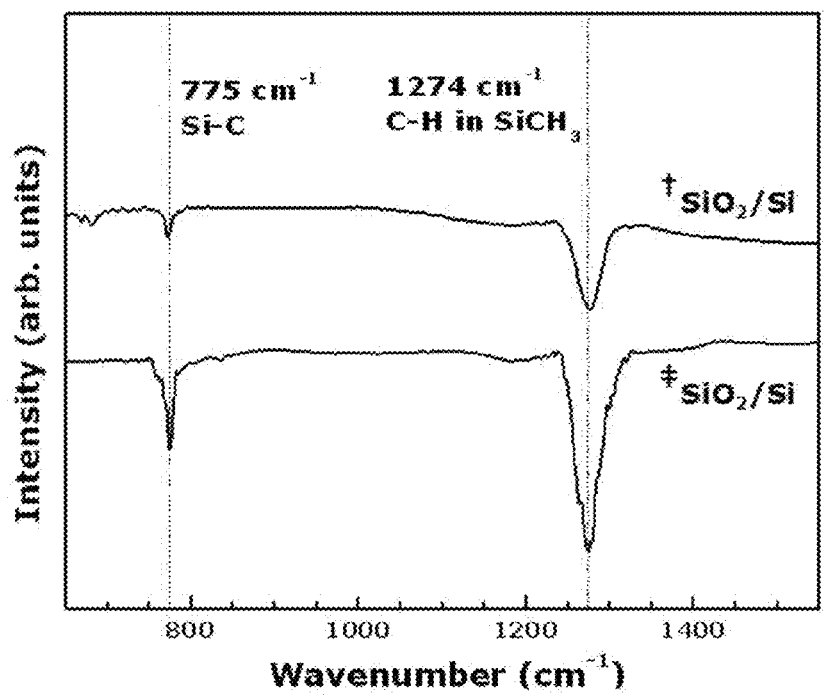
FIG. 7b shows a FTIR analysis result of a hydrogen plasma- and hydrocarbon plasma-treated $SiO_2$/Si substrate and an *$SiO_2$/Si substrate thermally treated in the presence of a mixture gas of hydrogen and hydrocarbon.

The improved nucleation owing to the change in the molecular bonding on the substrate surface was further confirmed by Fourier transform infrared spectroscopy (FTIR) analysis. FIG. 7a shows an FTIR analysis result of the *$SiO_2$/Si substrate with that of the bare $SiO_2$/Si substrate subtracted. Referring to FIG. 7a, the three peaks at about 974 cm$^{-1}$ (Si—OH), 2260 cm$^{-1}$ ($SiO_3$—H) and 3650 cm$^{-1}$ (Si—OH) were attributed to the newly formed bonds, while the peak at 1050 cm$^{-1}$ (Si—O—Si) was attributed to the group that disappeared. By contrast, the Firm analysis result from the hydrogen plasma- and hydrocarbon plasma-treated $SiO_2$/Si substrate and the *$SiO_2$/Si substrate thermally treated in the presence of the mixture gas of hydrogen and hydrocarbon shown in FIG. 7b, where the spectrum from the bare $SiO_2$/Si substrate was subtracted, greatly differed from that of FIG. 7a. Specifically, peaks were observed at 775 $cm^{-1}$ and 1274 $cm^{-1}$ in FIG. 7b, which were attributed to the Si—C and the C—H bond in Si—$CH_3$, respectively. The same result was observed in the hydrocarbon plasma treatment and the thermal treatment.

Thus, it was confirmed that the hydrogen plasma treatment resulted in the formation of Si—OH, while the hydrocarbon and hydrogen plasma treatment and the thermal treatment resulted in the formation of Si—$CH_3$ on $SiO_2$. One could easily expect that the newly formed Si—OH and Si—$CH_3$ groups would result in some modifications in the electrostatic nature of the surface, due to the difference in polarities of the $SiO_2$ and Si—O bonds. The zeta potentials of the substrates were analyzed in two different ways, as described in Table 2.

TABLE 2

Zeta potential of particles and substrate

| Substrate | Zeta potentials [mV] measured using Monitor solution (Latex particle + 10 mM NaCl aqueous solution) | | | Zeta potentials [mV] measured using Seeding suspension (Nano diamond particle + Methanol) | | |
|---|---|---|---|---|---|---|
| | Particle ($\zeta_P$) | Substrate ($\zeta_S$) | $\zeta_P - \zeta_S$ | Particle ($\zeta_P$) | Substrate ($\zeta_S$) | $\zeta_P - \zeta_S$ |
| $SiO_2$/Si | −1.50 | −28.30 | +26.80 | +30.01 | −28.60 | +58.61 |
| *$SiO_2$/Si | −5.23 | −31.03 | +25.80 | +37.51 | −63.84 | +101.35 |
| **$SiO_2$/Si | +1.02 | −22.71 | +23.73 | +1.82 | −1.13 | +2.95 |
| ***$SiO_2$/Si | +4.26 | −21.63 | +25.89 | +10.37 | +14.85 | −4.48 |

Firstly, the zeta potential of the particles ($\zeta_p$) and the zeta potential of the substrate ($\zeta_s$) were measured using a standard solution. Secondly, the zeta potential of the particles ($\zeta_p$) and the zeta potential of the substrate ($\zeta_s$) were measured using a methanol solution in which nanodiamond particles were dispersed, which was used in the ultrasonic seeding. The standard solution was a 10 mM NaCl aqueous solution in which latex particles are dispersed, as described in Table 2.

When the standard solution was used, there was no significant difference in the zeta potential of the substrate ($\zeta_s$), with about −28.30 mV for the bare $SiO_2$/Si, about −31.03 mV for the *$SiO_2$/Si substrate, about −22.71 in V for the $SiO_2$/Si substrate and about −21.63 mV for the *$SiO_2$/Si substrate. Since the zeta potential of the particles ($\zeta_p$) in the standard solution is close to zero in absolute value, within ±5 mV, the latex particles are not ultrasonically seeded onto the substrate surface. For this reason, no significant difference was observed as a result of the substrate treatment in the zeta potential of the substrate ($\zeta_s$).

In contrast, when the diamond-dispersed solution was used, there was significant difference in the zeta potential of the substrate ($\zeta_s$), with about −28.60 mV for the bare $SiO_2$/Si, about −63.84 mV for the *$SiO_2$/Si substrate, about −1.13 in for the $SiO_2$/Si substrate and about +14.85 mV for the *$SiO_2$/Si substrate. The significant increase in the zeta potential ($\zeta_s$) of the *$SiO_2$/Si substrate in the negative (−) direction as compared to that of the bare $SiO_2$/Si substrate is attributed to the increase in the negative (−) potential due to the change of some of the Si—O bonding of $SiO_2$ to the Si—OH bonding owing to the hydrogen plasma treatment. By contrast, as for the $SiO_2$/Si substrate and the *$SiO_2$/Si substrate, it is presumed that the Si—O bonding is changed to the Si—$CH_3$ bonding and, as a result, the ionized $CH_3^+$ results in the increase of the zeta potential of the substrate ($\zeta_s$) in the positive (+) direction. The zeta potential of the particles ($\zeta_p$) show large difference for different substrates, from +1.82 mV to +37.51 mV, which is due to the substrate surface treatment.

When the diamond-dispersed solution was used, the zeta potential of the substrate ($\zeta_s$) was negative (−), whereas the zeta potential of the particles ($\zeta_p$) was positive (+) except for the ***$SiO_2$/Si substrate. The difference between the zeta potential of the particles ($\zeta_p$) and the zeta potential of the substrate ($\zeta_s$) was the greatest for the *$SiO_2$/Si substrate (+101.35 mV), followed by the bare $SiO_2$/Si (+58.61 mV), the $SiO_2$/Si substrate (+2.95 mV) and the *$SiO_2$/Si substrate (−4.48 mV). This trend exactly coincided with the order of the nucleation density of the substrates shown in FIG. 2. Accordingly, it can be concluded that the diamond nucleation density during the ultrasonic seeding increases as the absolute value of the difference between the zeta potential of the particles ($\zeta_p$) and the zeta potential of the substrate ($\zeta_s$) is larger.

Hence, the present disclosure introduces the concept of the zeta potential of the particles ($\zeta_p$) and the zeta potential of the substrate ($\zeta_s$) for improvement of nucleation density and a method for controlling same.

Meanwhile, this result proves that the ultrasonic seeding using the nanodiamond particles leads to the physical bonding of the nanodiamond particles to the substrate surface via electrostatic attraction, unlike microdiamond particles which result in defects through scratching. The physical bonding is changed into a chemical bonding during the following chemical vapor deposition process.

Figure 8A:
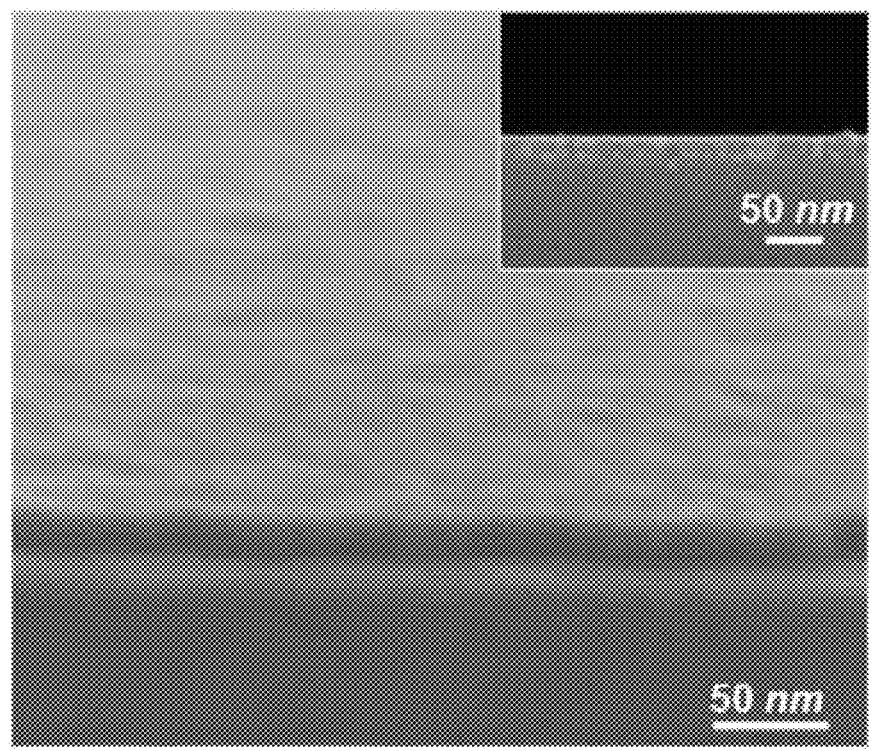
FIG. 8a shows an HR-SEM image of a UNCD thin film formed on a hydrogen plasma-treated substrate.
Figure 8B:
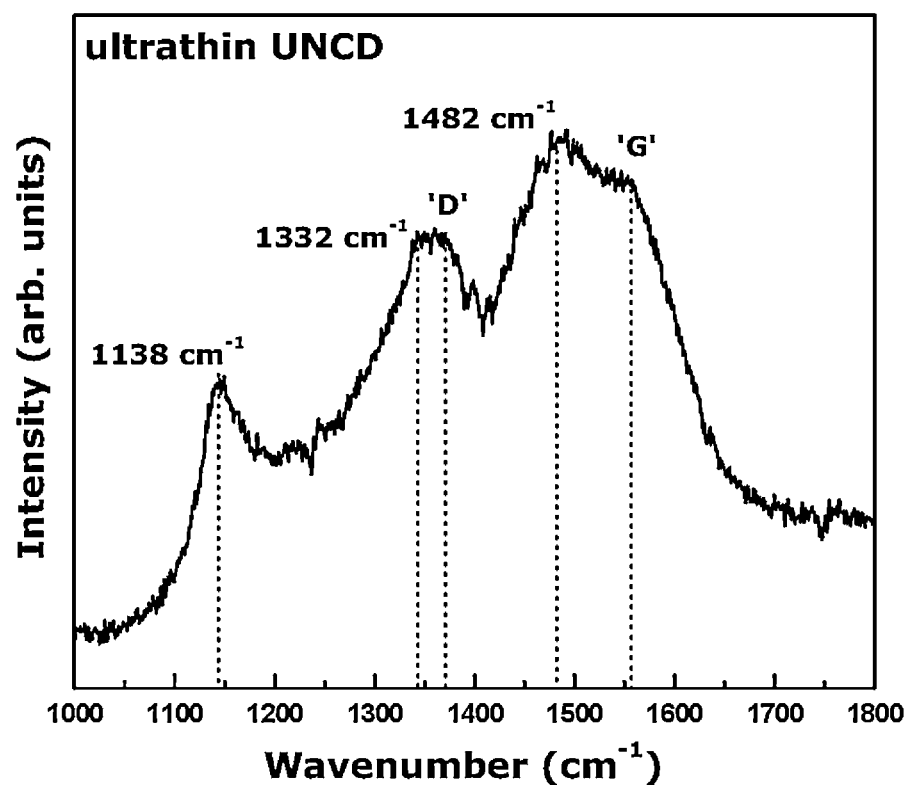
FIG. 8b shows a Raman spectrum of the UNCD thin film of FIG. 8a ($\lambda$=514.5 nm).

FIG. 8a shows an HR-SEM image of the UNCD thin film formed on a hydrogen plasma-treated substrate. The UNCD thin film was continuous and thinner than any one reported thus far, with a thickness not greater than 30 nm. FIG. 8b shows a Raman spectrum of the UNCD thin film of FIG. 8a (λ=514.5 nm). Apart from D and G bands, extra peaks were observed at about 1138 $cm^{-1}$, 1332 $cm^{-1}$ and 1482 $cm^{-1}$, which were typical in UNCD with a grain size of 10 nm or smaller.

The nanocrystalline diamond thin film and method for fabricating same according to the embodiments provide the following advantageous effect.

A uniform void-free nanocrystalline diamond thin film may be fabricated on a silicon oxide-coated substrate by performing hydrogen plasma treatment, hydrocarbon plasma treatment or hydrocarbon thermal treatment on the substrate surface to maximize electrostatic attraction between the substrate surface and nanodiamond particles during ultrasonic seeding such that the nanodiamond particles are uniformly distributed and bound on the silicon oxide on the substrate.

While the exemplary embodiments have been shown and described, it will be understood by those skilled in the art that various changes in form and details may be made thereto without departing from the spirit and scope of the present disclosure as defined by the appended claims.

What is claimed is:

1. A method for fabricating a nanocrystalline diamond thin film, comprising:
   preparing a silicon oxide-coated silicon substrate;
   surface-treating the substrate;
   immersing the substrate in a suspension of nanodiamond particles and dispersing and binding the nanodiamond particles onto the substrate by applying ultrasonic wave; and
   growing a nanocrystalline diamond thin film on the substrate on which the nanodiamond particles are bound,
   wherein, as a result of the surface treatment, an absolute value of a potential difference between the substrate and the nanodiamond particles becomes larger than that before the surface treatment, wherein said surface-treating the substrate comprises changing an Si—O bond of silicon oxide to a silanol group.

2. The method according to claim 1, wherein said surface-treating the substrate comprises treating the substrate surface with a hydrogen plasma.

3. The method according to claim 1, wherein said surface-treating the substrate comprises treating the substrate surface with a hydrogen plasma and a hydrocarbon plasma.

4. The method according to claim 1, wherein said surface-treating the substrate comprises thermally treating the substrate under a mixture gas atmosphere of hydrogen and hydrocarbon.

5. The method according to claim 1, wherein, as a result of the surface treatment, a potential of the substrate increases in negative (−) direction.

6. The method according to claim 1, wherein, as a result of the surface treatment, an absolute value of a difference between a zeta potential ($\zeta_p$) of the particles and a zeta potential ($\zeta_s$) of the substrate becomes larger than that before the surface treatment.

7. The method according to claim 1, wherein the nanocrystalline diamond thin film is grown by chemical vapor deposition.

8. A method for fabricating a nanocrystalline diamond thin film, comprising:
   preparing a silicon oxide-coated silicon substrate;
   surface-treating the substrate;
   immersing the substrate in a suspension of nanodiamond particles and dispersing and binding the nanodiamond particles onto the substrate by applying ultrasonic wave; and
   growing a nanocrystalline diamond thin film on the substrate on which the nanodiamond particles are bound,
   wherein, as a result of the surface treatment, an absolute value of a potential difference between the substrate and the nanodiamond particles becomes larger than that before the surface treatment, wherein said surface-treating the substrate comprises changing an Si—O bond of silicon oxide to a Si—CH$_3$ bond.

9. The method according to claim 8, wherein said surface-treating the substrate comprises treating the substrate surface with a hydrogen plasma and a hydrocarbon plasma.

10. The method according to claim 8, wherein said surface-treating the substrate comprises thermally treating the substrate under a mixture gas atmosphere of hydrogen and hydrocarbon.

11. The method according to claim 8, wherein, as a result of the surface treatment, a potential of the substrate increases in negative (−) direction.

12. The method according to claim 8, wherein, as a result of the surface treatment, an absolute value of a difference between a zeta potential ($\zeta_p$) of the particles and a zeta potential ($\zeta_s$) of the substrate becomes larger than that before the surface treatment.

13. The method according to claim 8, wherein the nanocrystalline diamond thin film is grown by chemical vapor deposition.

14. A method for fabricating a nanocrystalline diamond thin film, the method comprising:
   treating a silicon oxide surface to convert a portion of the silicon oxide surface to comprise at least a Si—OH bond and/or a Si—CH$_3$ bond;
   immersing while ultrasonicating the treated silicon oxide surface in a suspension of nanodiamond particles and dispersing and binding the nanodiamond particles onto the treated silicon oxide; and
   growing a nanocrystalline diamond thin film on the substrate on which the nanodiamond particles are bound.

15. The method according to claim 14, wherein treating the silicon oxide surface comprises treating the silicon oxide surface with a hydrogen plasma.

16. The method according to claim 15, wherein the hydrogen plasma is generated within a DC-plasma assisted CVD (DC-PACVD).

17. The method according to claim 14, wherein treating the silicon oxide surface comprises treating the silicon oxide surface with a hydrogen plasma and a hydrocarbon plasma.

18. The method according to claim 17, wherein the hydrogen plasma and the hydrocarbon plasma is generated within a DC-plasma assisted CVD (DC-PACVD).

19. The method according to claim 14, wherein treating the silicon oxide surface comprises thermally treating the silicon oxide surface with a mixture gas atmosphere of hydrogen and hydrocarbon.

20. The method according to claim 14, wherein thermally treating comprising loading the silicon oxide surface into hot filament CVD (HFCVD) chamber and supplying a mixture of hydrogen and hydrocarbon gases into the HFCVD chamber.

* * * * *